United States Patent
Camacho et al.

(10) Patent No.: US 8,252,634 B2
(45) Date of Patent: Aug. 28, 2012

(54) INTEGRATED CIRCUIT PACKAGING SYSTEM WITH A LEADFRAME HAVING RADIAL-SEGMENTS AND METHOD OF MANUFACTURE THEREOF

(75) Inventors: Zigmund Ramirez Camacho, Singapore (SG); Jose Alvin Caparas, Singapore (SG); Lionel Chien Hui Tay, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 69 days.

(21) Appl. No.: 12/488,043

(22) Filed: Jun. 19, 2009

(65) Prior Publication Data

US 2010/0320590 A1 Dec. 23, 2010

(51) Int. Cl.
*H01L 21/00* (2006.01)
(52) U.S. Cl. .......................... 438/123; 438/108; 438/109
(58) Field of Classification Search .................. 438/108, 438/109, 123
See application file for complete search history.

(56) References Cited

U.S. PATENT DOCUMENTS

| | | | |
|---|---|---|---|
| 4,234,666 A * | 11/1980 | Gursky | 428/573 |
| 4,943,843 A * | 7/1990 | Okinaga et al. | 257/666 |
| 6,197,615 B1 * | 3/2001 | Song et al. | 438/111 |
| 7,102,210 B2 | 9/2006 | Ichikawa | |
| 7,148,529 B2 * | 12/2006 | Oida et al. | 257/294 |
| 7,683,494 B1 * | 3/2010 | Stortini et al. | 257/785 |
| 2002/0056892 A1 * | 5/2002 | Corisis | 257/666 |
| 2005/0156291 A1 * | 7/2005 | Shiu et al. | 257/666 |
| 2006/0097366 A1 * | 5/2006 | Sirinorakul et al. | 257/666 |
| 2007/0069343 A1 * | 3/2007 | Takasou et al. | 257/666 |
| 2007/0108565 A1 * | 5/2007 | Shim et al. | 257/676 |
| 2008/0237814 A1 * | 10/2008 | Bayan | 257/666 |

FOREIGN PATENT DOCUMENTS

JP 04192450 * 7/1992

* cited by examiner

*Primary Examiner* — James Mitchell
(74) *Attorney, Agent, or Firm* — Ishimaru & Associates LLP; Mikio Ishimaru; Stanley M. Chang

(57) ABSTRACT

A method of manufacture of an integrated circuit packaging system includes: providing inwardly converging leadfingers having continuously decreasing widths along lengths thereof to inward ends thereof; electrically connecting an integrated circuit device on the leadfingers only on portions of the continuously decreasing widths; and encapsulating the integrated circuit device and the leadfingers with an encapsulation.

20 Claims, 4 Drawing Sheets

INTEGRATED CIRCUIT PACKAGING SYSTEM WITH A LEADFRAME HAVING RADIAL-SEGMENTS AND METHOD OF MANUFACTURE THEREOF

TECHNICAL FIELD

The present invention relates generally to an integrated circuit packaging system and more particularly to a system for utilizing a leadframe having radial-segments in an integrated circuit packaging system.

BACKGROUND ART

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing inwardly converging leadfingers having continuously decreasing widths along lengths thereof to inward ends thereof; electrically connecting an integrated circuit device on the leadfingers only on portions of the continuously decreasing widths; and encapsulating the integrated circuit device and the leadfingers with an encapsulation.

The present invention provides an integrated circuit packaging system including: inwardly converging leadfingers having continuously decreasing widths along lengths thereof to inward ends thereof; an integrated circuit device electrically connected on the leadfingers only on portions of the continuously decreasing widths; and an encapsulation that encapsulates the integrated circuit device and the leadfingers.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
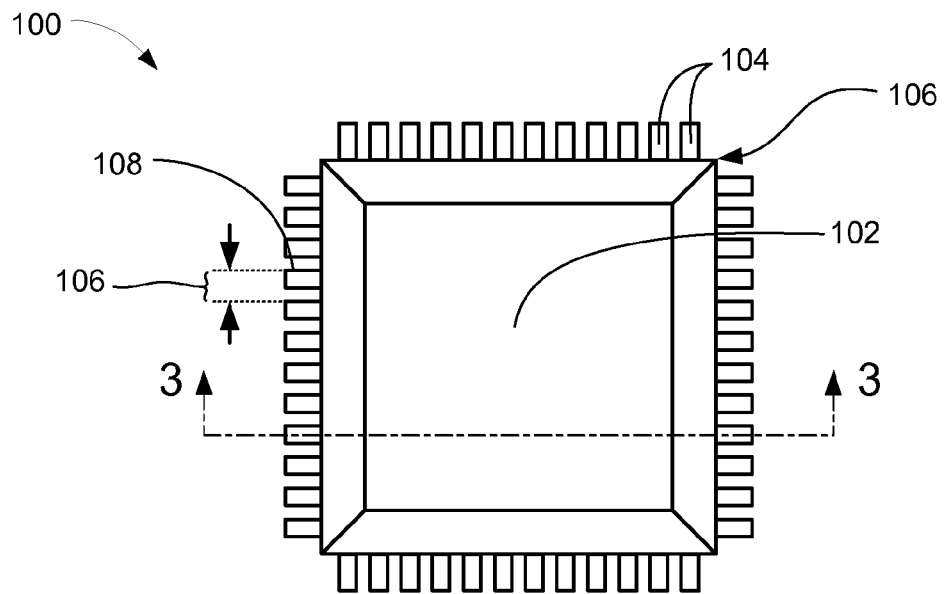
FIG. 1 is a top view of an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

For expository purposes, the term "horizontal" as used herein is defined as a plane parallel to the plane or surface of the leadframe, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in an embodiment of the present invention. The integrated circuit packaging system 100 is shown having an encapsulation 102 with external leads 104 extending from an edge 106 of the encapsulation 102. The external leads 104 have a pitch 106 which is defined as the distance between a leading edge 108 of one external lead 104 and the leading edge 108 of an adjacent external lead 104.

Figure 2A:
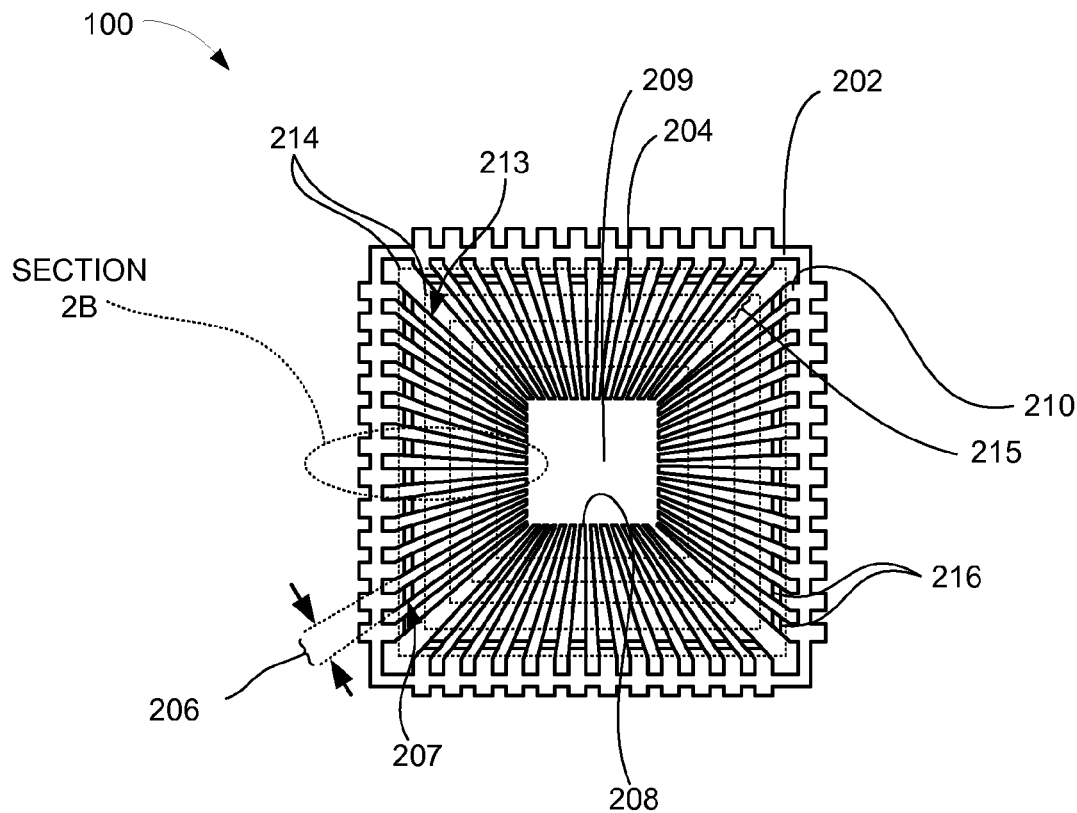
FIG. 2A is the integrated circuit packaging system of FIG. 1 in a leadframe providing phase of manufacture.

Referring now to FIG. 2A, therein is shown the integrated circuit packaging system 100 of FIG. 1 in a leadframe providing phase of manufacture. The integrated circuit packaging system 100 is shown having a leadframe 202 with leadfingers 204 such as inwardly converging leadfingers.

The leadfingers 204 have pitches 206 which is defined as the distance between a leading edge 207 of one leadfinger 204 and the leading edge 207 of an adjacent leadfinger 204. The pitches 206 of the leadfingers 204 vary with near average uniformity along the majority of the leadfingers 204 increasing from a fine pitch 208 near a center 209 to a large pitch 210 adjacent the leadframe 202. Inwardly converging is defined as converging toward the center 209.

Since the pitches 206 of the leadfingers 204 vary with near average uniformity along the majority of the leadfingers 204, the leadfingers 204 have a straight edge 213 extending from near the center 209 where the leadfingers 204 have a fine pitch 208 all the way close to, and adjacent the leadframe 202, where the leadfingers 204 have a large pitch 210.

It has been discovered that the leadfingers 204 provide increased flexibility to attach components having diverse connection pitches. This reduces costs by allowing one lead frame to be used in many varied applications without having to redesign between components.

The leadfingers 204 may be segmented into zones such as radial-segments 214 encircling the center 209. The radial-segments 214 demark a range of pitches 215 on the leadfingers 204. The range of pitches 215 may correspond to the pitch of a component that will be mounted to the leadfingers 204. It has been discovered that the use of the radial-segments 214 greatly increase the versatility of the leadframe 202 by facilitating the attachment of a nearly infinite assortment of components with unique attachment pitches. The radial-segments 214 may be individually tailored to the pitch and size of components allowing one leadframe to be used for multiple applications.

Across the leadfingers 204, solder-capture-trenches 216 may be created. The solder-capture-trenches 216 may be created at any point across the leadfingers 204 adding to the versatility of the leadframe 202. The solder-capture-trenches 216 are defined as structures created across a surface of the leadfingers 204, which use surface tension of the solder to prevent the solder from spreading outside of the solder-capture-trenches 216 on the leadfingers 204 during a reflow process.

The radial-segments 214 are defined as an area demarcated along the leadfingers 204 having a sufficient span of the leadfingers 204 to contain the solder-capture-trenches 216 and include a sufficient span of the leadfingers 204 between the solder-capture-trenches 216 to mount a component with an interconnect such as a solder ball.

Figure 2B:
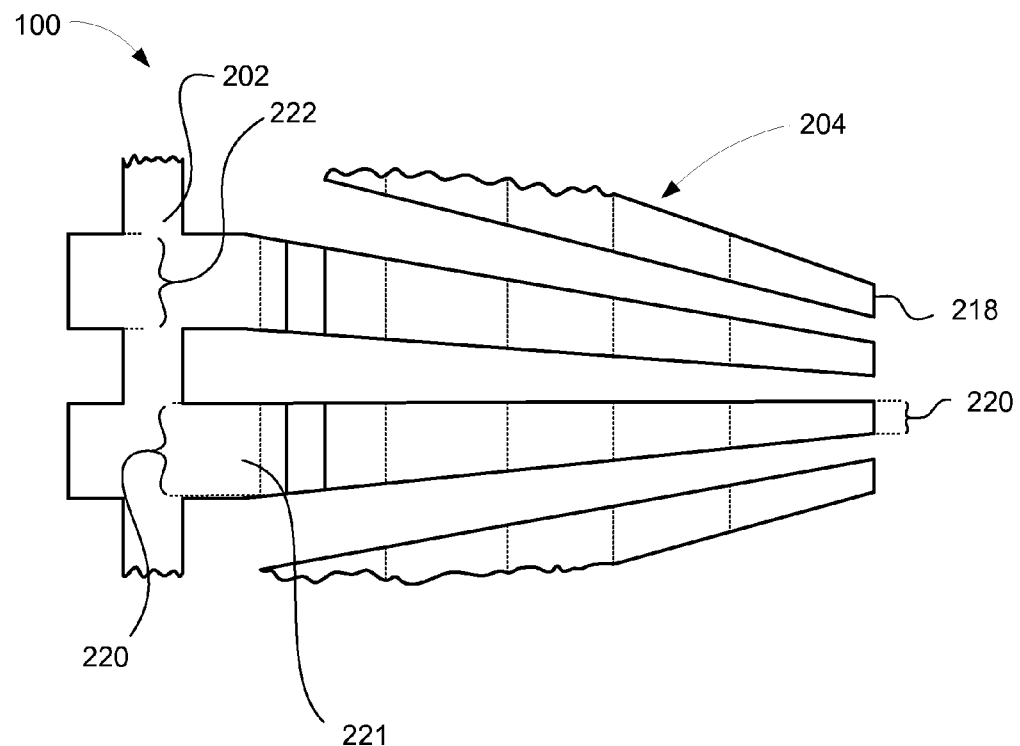
FIG. 2B is an expanded view of the integrated circuit packaging system of section 2B of FIG. 2A.

Referring now to FIG. 2B, therein is shown an expanded view of the integrated circuit packaging system 100 of section 2B of FIG. 2A. The integrated circuit packaging system 100 is shown having the leadfingers 204 with inward ends 218. The leadfingers 204 are also shown having continuously decreasing widths 220 that continuously decrease along a length of the leadfingers 204 from outer ends 221 the near the leadframe 202 toward the inward ends 218 of the lead fingers.

The leadfingers 204 are further shown having constant widths 222 adjacent the leadframe 202 and juxtaposed to the continuously decreasing widths 220.

Figure 3:
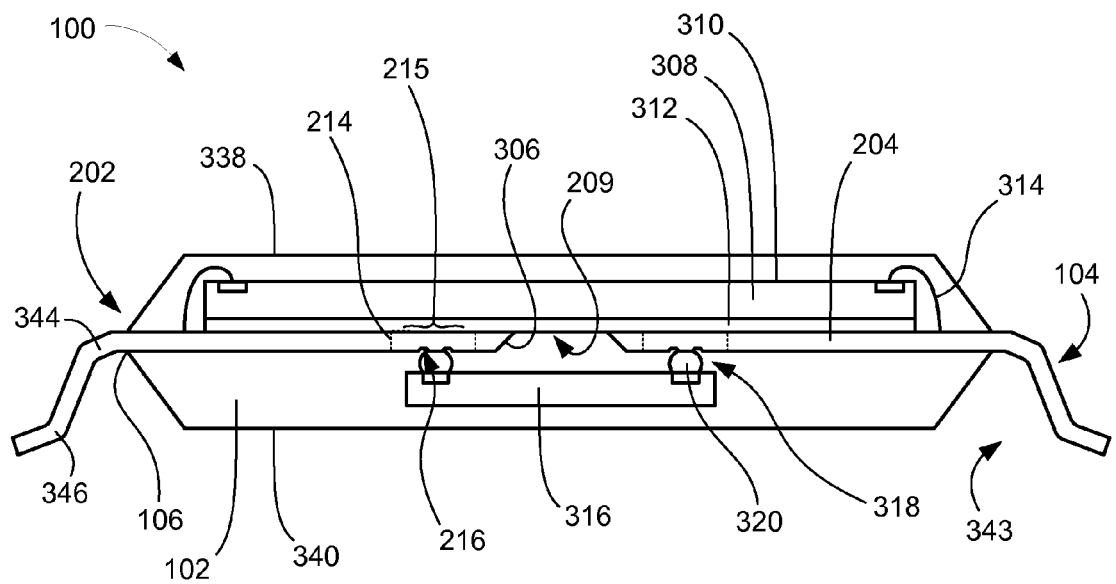
FIG. 3 is a cross-sectional view of the integrated circuit packaging system along the line 3-3 of FIG. 1.

Referring now to FIG. 3, therein is shown a cross-sectional view of the integrated circuit packaging system 100 along the line 3-3 of FIG. 1. The integrated circuit packaging system 100 is shown having the leadfingers 204.

The leadfingers 204 have an angled-surface 306 bordering the center 209. The angled-surface 306 helps to create a finer pitch around the center 209.

Mounted above the leadfingers 204 is an integrated circuit device such as a wire-bonded die 308 with an active side 310. The active side 310 of the wire-bonded die 308 faces away from the leadfingers 204.

The wire-bonded die 308 is attached to the leadfingers 204 with a die attach adhesive 312. The die attach adhesive 312 should be electrically non-conductive to ensure the isolation of the leadfingers 204.

The active side 310 is connected to the leadfingers 204 with interconnects such as bond wires 314. The bond wires 314 can loop over and extend beyond a periphery of the wire-bonded die 308. The bond wires 314 can be connected to the portions of the leadfingers 204 that are continuously decreasing in width. Mounted below the leadfingers 204 is a further integrated circuit device such as a flip-chip 316 having a predetermined pitch such as a compatible pitch 318. The flip-chip 316 is connected to the leadfingers 204 with electrical contacts such as solder joints 320. The compatible pitch 318 is defined as a pitch of the solder joints 320 on the flip-chip 316 that match the range of pitches 215 demarcated by the radial-segments 214. The electrical contacts, such as the solder joints 320, can attach to the radial-segments 214 on the leadfingers 204.

The solder joints 320 connect the flip-chip 316 to the leadfingers 204 around the center 209. Bordering the solder joints 320, the solder-capture-trenches 216 are created in the leadfingers 204. The solder-capture-trenches 216 keep the solder joints 320 from spreading along the leadfingers 204, by taking advantage of the surface tension of the solder joints 320 during reflow.

Encapsulating the wire-bonded die 308, the flip-chip 316 is the encapsulation 102 having the edge 106, a top side 338 and a bottom side 340. The encapsulation 102 partially encapsulates the leadfingers 204 leaving the external leads 104 extending outward from the edge 106 of the encapsulation 102. The external leads 104 are defined as the portions of the leadfingers 204 that are not encapsulated. The external leads 104 have bent portions 343 such as a first bend 344 downward and a second bend 346 outward away from the encapsulation 102.

Figure 4:
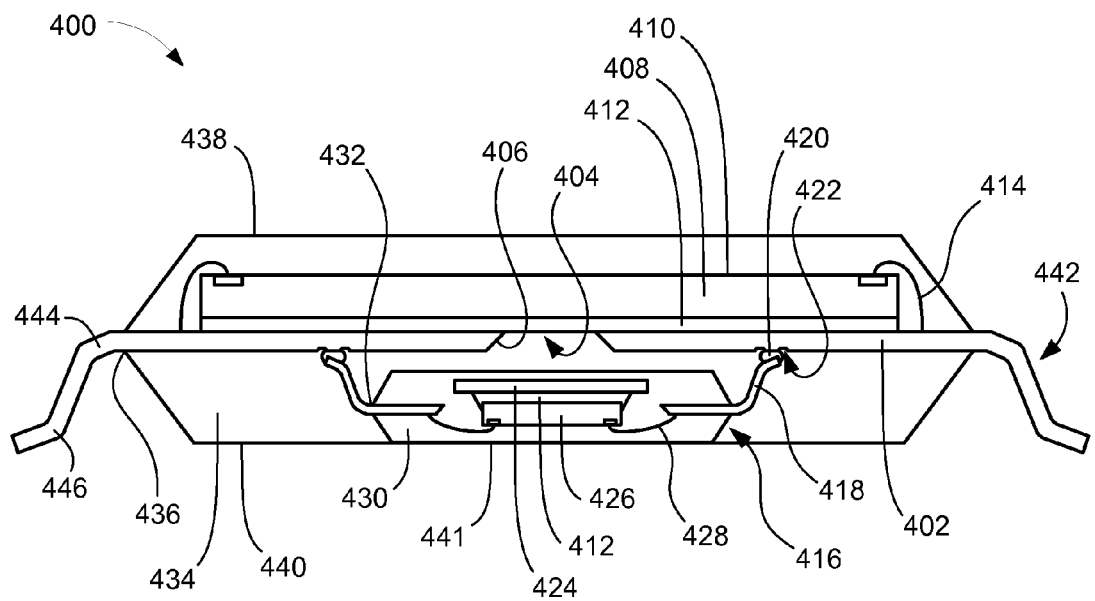
FIG. 4 is a cross-sectional view of an integrated circuit packaging system in a further embodiment of the present invention.

Referring now to FIG. 4, therein is shown a cross-sectional view of an integrated circuit packaging system 400 in a further embodiment of the present invention. The integrated circuit packaging system 400 is shown having leadfingers 402.

The leadfingers 402 have a center 404 created in the center of the leadfingers 402. The leadfingers 402 has an angled-surface 406 bordering the center 404. The angled-surface 406 helps to create a finer pitch around the center 404.

Mounted above the leadfingers 402 is an integrated circuit such as a wire-bonded die 408 with an active side 410. The active side 410 of the wire-bonded die 408 faces away from the leadfingers 402.

The wire-bonded die 408 is attached to the leadfingers 402 with a die attach adhesive 412. The die attach adhesive 412 should be electrically non-conductive to ensure the isolation of the leadfingers 402.

The active side 410 is connected to the leadfingers 402 with interconnects such as bond wires 414. Mounted below the leadfingers 402 is an integrated circuit device such as a leaded integrated circuit package such as a quad-flat-pack 416.

The quad-flat-pack 416 has quad-flat-pack-leadfingers 418, which extend toward the leadfingers 402 and connect to the leadfingers 402 with solder joints 420. Bordering the solder joints 420, solder-capture-trenches 422 are created in the leadfingers 402.

The solder-capture-trenches 422 keep the solder joints 420 from spreading along the leadfingers 402. The quad-flat-pack 416 has a die-pad 424 with a quad-flat-pack-integrated-circuit 426 mounted below.

The quad-flat-pack-integrated-circuit 426 is attached to the die-pad 424 with the die attach adhesive 412 and connected to the quad-flat-pack-leadfingers 418 with quad-flat-pack-bond-wires 428. Encapsulating the quad-flat-pack-integrated-circuit 426 is a quad-flat-pack-encapsulation 430. The quad-flat-pack-encapsulation 430 partially encapsulates the quad-flat-pack-leadfingers 418.

The quad-flat-pack-leadfingers 418 bend up toward the leadfingers 402 at an edge 432 of the quad-flat-pack-encapsulation 430. The quad-flat-pack 416 is centered under the center 404 and the quad-flat-pack-leadfingers 418 connect around the center 404 in the leadfingers 402.

Encapsulating the wire-bonded die 408 is an encapsulation 434 having an edge 436, a top side 438 and a bottom side 440. The encapsulation 434 partially encapsulates the quad-flat-pack 416 leaving a surface 441, such as a package surface, exposed from the bottom side 440 of the encapsulation 434.

The encapsulation 434 partially encapsulates the leadfingers 402 leaving external leads 442 extending outward from the edge 436 of the encapsulation 434. The external leads 442 have a first bend 444 downward and a second bend 446 outward away from the encapsulation 434.

Figure 5A:
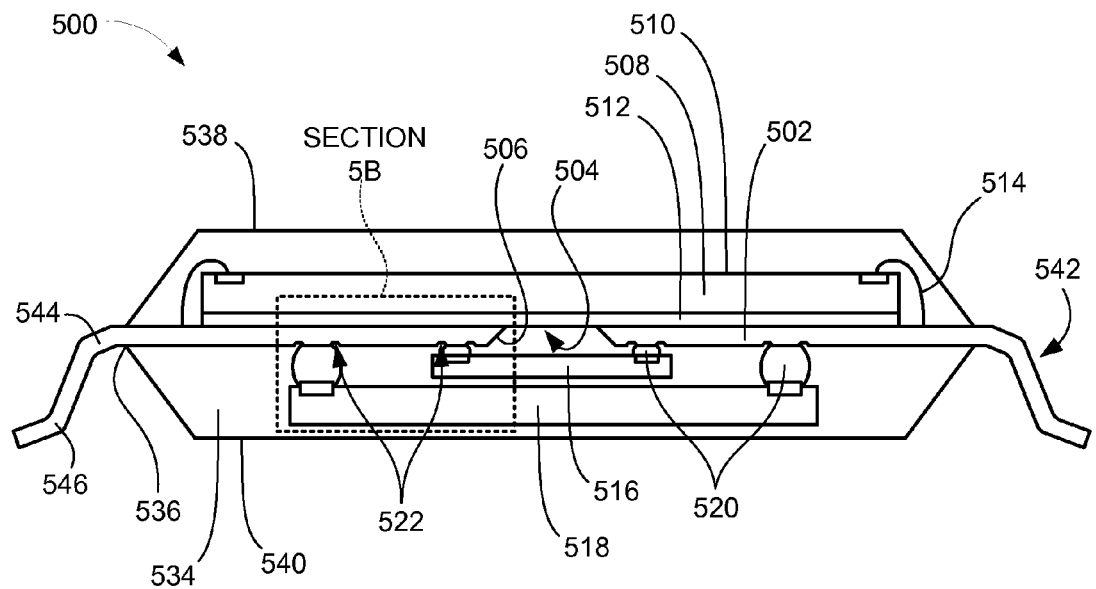
FIG. 5A is a cross-sectional view of an integrated circuit packaging system in a further embodiment of the present invention.

Referring now to FIG. 5A, therein is shown a cross-sectional view of an integrated circuit packaging system 500 in a further embodiment of the present invention. The integrated circuit packaging system 500 is shown having leadfingers 502.

The leadfingers 502 have a center 504 created in the center of the leadfingers 502. The leadfingers 502 has an angled-surface 506 bordering the center 504. The angled-surface 506 helps to create a finer pitch around the center 504.

Mounted above the leadfingers 502 is an integrated circuit such as a wire-bonded die 508 with an active side 510. The active side 510 of the wire-bonded die 508 faces away from the leadfingers 502.

The wire-bonded die 508 is attached to the leadfingers 502 with a die attach adhesive 512. The die attach adhesive 512 should be electrically non-conductive to ensure the isolation of the leadfingers 502.

The active side 510 is connected to the leadfingers 502 with interconnects such as bond wires 514. Mounted below the leadfingers 502 is a first integrated circuit device such as a first flip-chip 516.

Further, mounted below the first flip-chip 516 and the leadfingers 502 is a second integrated circuit device such as a second flip-chip 518. The first flip-chip 516 is connected to the leadfingers 502 with interconnects such as solder joints 520. The solder joints 520 connect the first flip-chip 516 to the leadfingers 502 around the center 504.

The second flip-chip 518 is also connected to the leadfingers 502 with the solder joints 520. The solder joints 520 connect the second flip-chip 518 to the leadfingers 502 peripheral to the first flip-chip 516.

Bordering the solder joints 520, solder-capture-trenches 522 are created in the leadfingers 502. The solder-capture-trenches 522 keep the solder joints 520 from spreading along the leadfingers 502.

Encapsulating the wire-bonded die 508, the first flip-chip 516 and the second flip-chip 518, is an encapsulation 534 having an edge 536, a top side 538 and a bottom side 540. The encapsulation 534 partially encapsulates the leadfingers 502 leaving external leads 542 extending outward from the edge 536 of the encapsulation 534. The external leads 542 have a first bend 544 downward and a second bend 546 outward away from the encapsulation 534.

Figure 5B:
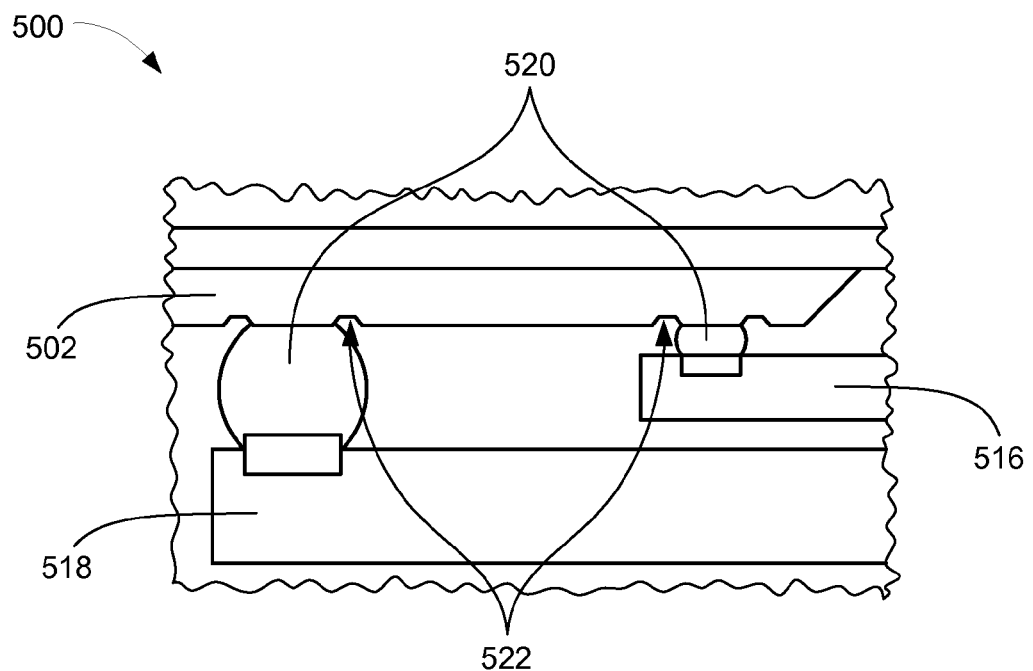
FIG. 5B is an expanded view of the integrated circuit packaging system of section 5B of FIG. 5A.

Referring now to FIG. 5B, therein is shown an expanded view of the integrated circuit packaging system 500 of section 5B of FIG. 5A. The integrated circuit packaging system 500 is shown having the solder joints 520 connecting the first flip-chip 516 and the second flip-chip 518 to the leadfingers 502. The leadfingers 502 is shown having the solder-capture-trenches 522 created in the leadfingers 502 and on either side of the solder joints 520.

Figure 6:
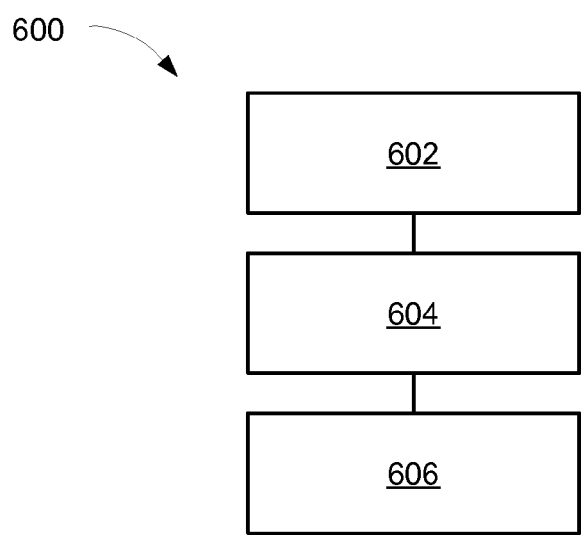
FIG. 6 is a flow chart of a method of manufacture of an integrated circuit packaging system in a further embodiment of the present invention.

Referring now to FIG. 6, therein is shown a flow chart of a method 600 of manufacture of an integrated circuit packaging system 100 of FIG. 1 in a further embodiment of the present invention. The method 600 includes providing inwardly converging leadfingers having continuously decreasing widths along lengths thereof to inward ends thereof in a block 602; electrically connecting an integrated circuit device on the leadfingers only on portions of the continuously decreasing widths in a block 604; and encapsulating the integrated circuit device and the leadfingers with an encapsulation in a block 606.

It has been discovered that the present invention thus has numerous aspects.

A principle aspect that has been discovered is that the present invention provides increased flexibility to attach components having diverse connection pitches. This reduces costs by allowing one lead frame to be used in many varied applications without having to redesign between components.

Another aspect of the radial-segments is greatly increased versatility of the leadframe when attaching various components. Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the leadframe system of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing inwardly converging leadfingers having continuously decreasing widths along lengths thereof to inward ends thereof;
   electrically connecting an integrated circuit device to the leadfingers only on portions of the continuously decreasing widths beyond a periphery of the integrated circuit device, with the integrated circuit device overlapping the inward ends of the leadfingers; and
   encapsulating the integrated circuit device and the leadfingers with an encapsulation.

2. The method as claimed in claim 1 further comprising:
   attaching a further integrated circuit device to a bottom side of the leadfingers; and wherein:
   encapsulating with the encapsulation includes only partially encapsulating the further integrated circuit device leaving a surface exposed from the encapsulation.

3. The method as claimed in claim 1 wherein:
   encapsulating the leadfingers includes only partially encapsulating the leadfingers leaving portions of constant widths of the lead finger exposed from an edge of the encapsulation.

4. The method as claimed in claim 1 further comprising:
   creating solder-capture-trenches in the leadfinger on the continuously decreasing widths.

5. The method as claimed in claim 1 wherein:
   providing the leadfingers includes providing the leadfingers having radial-segments.

6. A method of manufacture of an integrated circuit packaging system comprising:
   providing a leadframe with leadfingers having pitches that vary from a large pitch adjacent the leadframe and having continuously decreasing widths along lengths of the leadfingers to the inward ends of the leadfingers; to a fine pitch at inward ends away from the leadframe;
   electrically connecting an integrated circuit only on portions of the continuously decreasing widths device beyond a periphery of the integrated circuit device with the integrated circuit device overlapping the inward ends of the leadfingers;
   attaching a further integrated circuit device to a bottom side of the lead fingers with electrical contacts;
   encapsulating the integrated circuit device and the leadfingers with an encapsulation; and
   removing a portion of the leadframe adjacent to the leadfingers.

7. The method as claimed in claim 6 wherein:
   encapsulating with the encapsulation includes only partially encapsulating the further integrated circuit device leaving a package surface exposed from the encapsulation.

8. The method as claimed in claim 6 wherein:
   encapsulating the leadfingers includes only partially encapsulating the leadfingers leaving portions of constant widths exposed from an edge of the encapsulation; and
   further comprising:
   bending portions of the leadfingers exposed from the edge of the encapsulation.

9. The method as claimed in claim 6 further comprising:
   creating solder-capture-trenches in the leadfingers bordering the electrical contacts.

10. The method as claimed in claim 6 wherein:
    providing the leadframe includes providing the leadframe having radial-segments at the inward ends; and
    attaching the further integrated circuit device includes attaching the electrical contacts to the radial segments of the leadfingers.

11. An integrated circuit packaging system comprising:
    inwardly converging leadfingers having continuously decreasing widths along lengths thereof to inward ends thereof;
    an integrated circuit device electrically connected on the leadfingers only on portions of the continuously decreasing widths beyond a periphery of the integrated circuit device with the integrated circuit device overlapping the inward ends of the leadfingers; and
    an encapsulation over the integrated circuit device and the leadfingers.

12. The system as claimed in claim 11 further comprising:
    a further integrated circuit device attached to a bottom side of the leadfingers: and wherein:
    the encapsulation only partially encapsulates the further integrated circuit device leaving a surface exposed from the encapsulation.

13. The system as claimed in claim 11 wherein:
    the encapsulation only partially encapsulates the leadfingers leaving portions of constant widths of the leadfinger exposed from an edge of the encapsulation.

14. The system as claimed in claim 11 wherein:
    the leadfingers include solder-capture-trenches on the continuously decreasing widths.

15. The system as claimed in claim 11 wherein:
    the leadfingers include radial-segments.

16. The system as claimed in claim 11 wherein:
    the leadfingers have pitches that vary from a large pitch at outer ends of the leadfingers to a fine pitch at inward ends of the leadfingers; and
    further comprising:
    a further integrated circuit device attached to a bottom side of the leadfingers with electrical contacts.

17. The system as claimed in claim 16 wherein:
the encapsulation only partially encapsulates the further integrated circuit device leaving a package surface exposed from the encapsulation.

18. The system as claimed in claim 16 wherein:
the encapsulation only partially encapsulates the leadfingers leaving portions of constant widths exposed from an edge of the encapsulation; and
the leadfingers have bent portions exposed from the edge of the encapsulation.

19. The system as claimed in claim 16 wherein:
the leadfingers include solder-capture-trenches in the leadfingers bordering the electrical contacts.

20. The system as claimed in claim 16 wherein:
the leadfingers include radial-segments at the inward ends; and
the electrical contacts are attached to the radial-segments.

* * * * *